(12) United States Patent
Gradtke et al.

(10) Patent No.: US 8,952,259 B2
(45) Date of Patent: Feb. 10, 2015

(54) METHOD FOR PRODUCING A CERAMIC COMPONENT, CERAMIC COMPONENT AND COMPONENT ASSEMBLY

(75) Inventors: Oliver Gradtke, Reutlingen (DE); Walter Roethlingshoefer, Reutlingen (DE); Paul Wickett, Northville, MI (US)

(73) Assignee: Robert Bosch GmbH, Stuttgart (DE)

( * ) Notice: Subject to any disclaimer, the term of this patent is extended or adjusted under 35 U.S.C. 154(b) by 287 days.

(21) Appl. No.: 13/496,262

(22) PCT Filed: Sep. 1, 2010

(86) PCT No.: PCT/EP2010/062780
§ 371 (c)(1),
(2), (4) Date: Jun. 4, 2012

(87) PCT Pub. No.: WO2011/032838
PCT Pub. Date: Mar. 24, 2011

(65) Prior Publication Data
US 2012/0234583 A1 Sep. 20, 2012

(30) Foreign Application Priority Data
Sep. 15, 2009 (DE) .......................... 10 2009 029 485

(51) Int. Cl.
*H05K 1/03* (2006.01)
*H05K 3/40* (2006.01)
*H05K 3/46* (2006.01)

(52) U.S. Cl.
CPC ............ *H05K 3/4007* (2013.01); *H05K 1/0306* (2013.01); *H05K 3/4602* (2013.01)
USPC .......... 174/255; 427/97.8; 427/97.9; 427/555

(58) Field of Classification Search
CPC ............. H05K 1/03; H05K 3/10; H05K 3/28; B05D 3/06; B24C 3/322; B24C 7/0007

USPC .......................... 174/255; 427/97.8, 97.9, 555
See application file for complete search history.

(56) References Cited

U.S. PATENT DOCUMENTS 4,237,606 A 12/1980 Niwa et al.
4,713,494 A 12/1987 Oikawa et al.
(Continued)

FOREIGN PATENT DOCUMENTS

DE 19806801 9/1999
EP 0165575 12/1985
(Continued)

OTHER PUBLICATIONS

PCT/EP2010/062780 International Search Report dated Nov. 22, 2010 (Translation and Original, 6 pages).

*Primary Examiner* — Timothy Thompson
*Assistant Examiner* — Charles Pizzuto
(74) *Attorney, Agent, or Firm* — Michael Best & Friedrich LLP

(57) ABSTRACT

The invention relates to a method for producing a ceramic component, a ceramic component, and a component assembly having a ceramic component and a connection component. The method according to the invention for producing a ceramic component (1) comprises the steps: a) providing a ceramic substrate (2), wherein a conducting path (3) is arranged in the interior and/or on the surface of the ceramic substrate (2), and at least some regions of the ceramic substrate (2) are covered by a glaze (5); b) creating a contacting opening (6) in the glaze (5) in a region of a contact region (15) of the conducting path (3) to be contacted; c) applying a metallic layer (7) in the region of the contacting opening (6) for contacting the conducting path (3) in the contact region (15).

15 Claims, 3 Drawing Sheets

(56) References Cited

U.S. PATENT DOCUMENTS

| | | | |
|---|---|---|---|
| 4,767,672 A | | 8/1988 | Fujinaka et al. |
| 5,035,939 A | | 7/1991 | Conlon et al. |
| 5,637,834 A | * | 6/1997 | La Bate, Jr. et al. .......... 174/264 |
| 5,677,250 A | * | 10/1997 | Knapp ............................ 501/14 |
| 6,800,815 B1 | * | 10/2004 | Ehlert et al. .................. 174/262 |
| 2002/0047878 A1 | * | 4/2002 | Akanabe et al. ................ 347/68 |
| 2004/0145064 A1 | | 7/2004 | Kuramoto et al. |
| 2005/0078433 A1 | | 4/2005 | Ichiyanagi et al. |
| 2005/0255795 A1 | * | 11/2005 | Said ............................... 451/40 |
| 2009/0279162 A1 | * | 11/2009 | Chui ............................. 359/290 |

FOREIGN PATENT DOCUMENTS

| | | |
|---|---|---|
| GB | 2277202 | 10/1994 |
| JP | 56025038 | 3/1981 |
| JP | 61012054 | 1/1986 |
| JP | 61072698 | 4/1986 |
| JP | 2002252466 | 9/2002 |
| JP | 2004119770 | 4/2004 |
| JP | 2008306012 | 12/2008 |
| WO | 9103375 | 3/1991 |

* cited by examiner

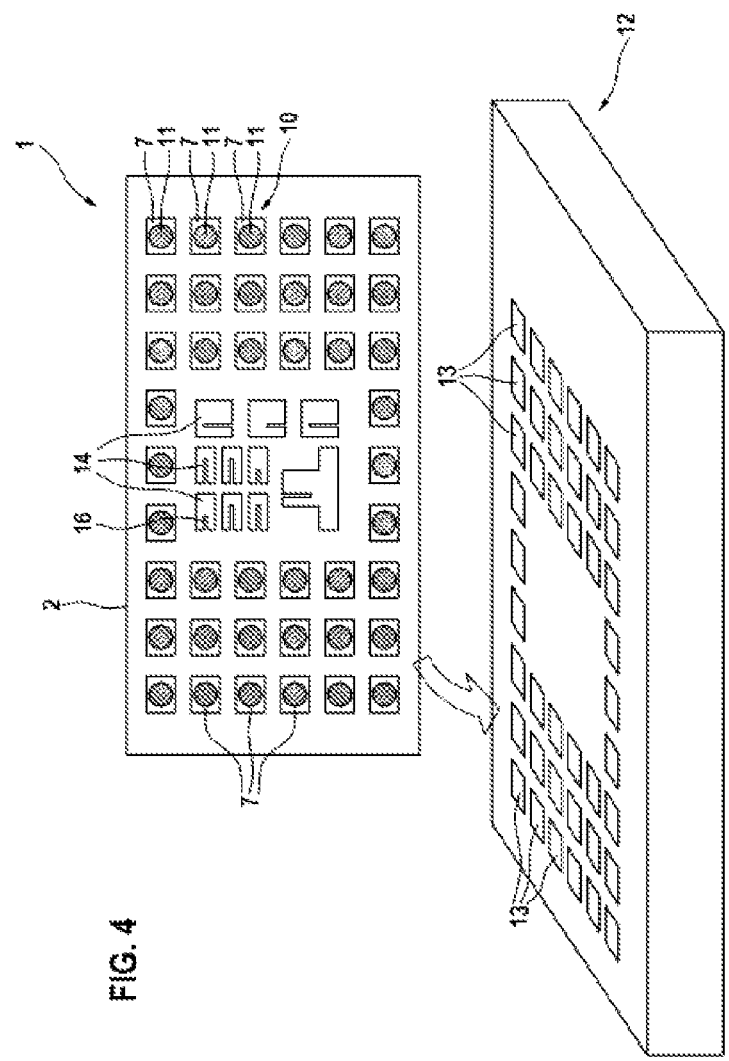

METHOD FOR PRODUCING A CERAMIC COMPONENT, CERAMIC COMPONENT AND COMPONENT ASSEMBLY

BACKGROUND OF THE INVENTION

The invention relates to a method for producing a ceramic component. Furthermore, the invention relates to a ceramic component and a component assembly comprising a ceramic component and a connection component.

It is known to use ceramic materials as substrates for electronic components. By way of example, U.S. Pat. No. 6,800,815 B1 discloses an electronic component comprising a multilayered ceramic substrate and also a multiplicity of conductor tracks running in the interior and/or on the surface of the ceramic substrate. A plurality of connection contacts are situated on the underside of the component, by means of which connection contacts electrical contact can be made with the conductor tracks externally. The electronic component is soldered onto a circuit board by means of a BGA (ball grid array). The BGA electrically connects the connection contacts of the electronic component to the circuit board.

SUMMARY OF THE INVENTION

The invention relates to a method for producing a ceramic component, comprising the following steps: a) providing a ceramic substrate, wherein a conductor track is situated in the interior and/or on the surface of the ceramic substrate, and the ceramic substrate is covered with a glaze at least in regions; b) producing a contact-making opening in the glaze in a region of the conductor track with which contact is to be made; c) applying a metallic layer in the region of the contact-making opening for making contact with the conductor track.

The glaze makes it possible to provide a protective layer and/or insulation layer by means of which, in particular, electrical components of the ceramic component, for example resistors or conductor tracks, can be mechanically and/or electrically protected. The ceramic substrate per se can also be protected by a glaze of this type. The glaze can advantageously be applied to the ceramic substrate in the course of the process for producing the latter, and to components connected to the ceramic substrate.

The method according to the invention enables conductor tracks covered by the glaze to be made accessible to external contact-making. Conductor tracks of this type can be both electrical and thermal conductor tracks for conducting a current or transferring heat. By opening the glaze in the region of the conductor track with which contact is to be made, and by applying a metallic layer, a metallic connection contact can be formed. In particular, it is possible in this way to produce a multiplicity of connection contacts which, arranged on a common rear side of the ceramic component, can be provided for example by means of a BGA for the electrical connection of the ceramic component to a further component.

The invention furthermore relates to a ceramic component, comprising a ceramic substrate, a glaze covering the ceramic substrate at least in regions, and a conductor track situated in the interior and/or on the surface of the ceramic substrate, wherein the glaze has a contact-making opening, and the ceramic component has a metallic layer in the region of the contact-making opening, wherein the metallic layer makes contact with a conductor track.

The invention furthermore relates to a component assembly, comprising a ceramic component according to the invention, a connection component and a BGA, wherein the metallic layer of the ceramic component is connected to a connection contact of the connection component by the BGA.

BRIEF DESCRIPTION OF THE DRAWINGS

The invention is explained in greater detail below on the basis of embodiments illustrated by drawings.

In the figures:

FIG. 4 shows a bottom view of the finished ceramic component, provided with a BGA, prior to being connected to a connection component.

DETAILED DESCRIPTION

Figure 1:
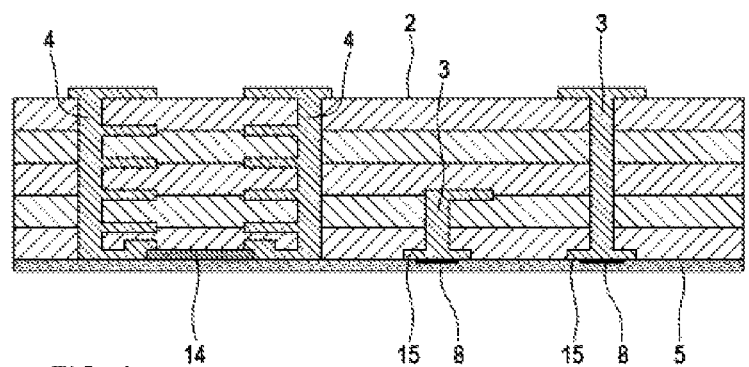
FIG. 1 shows a cross section through an embodiment in production of a ceramic component according to the invention, wherein the ceramic component comprises a ceramic substrate covered with a glaze in regions.
Figure 2:
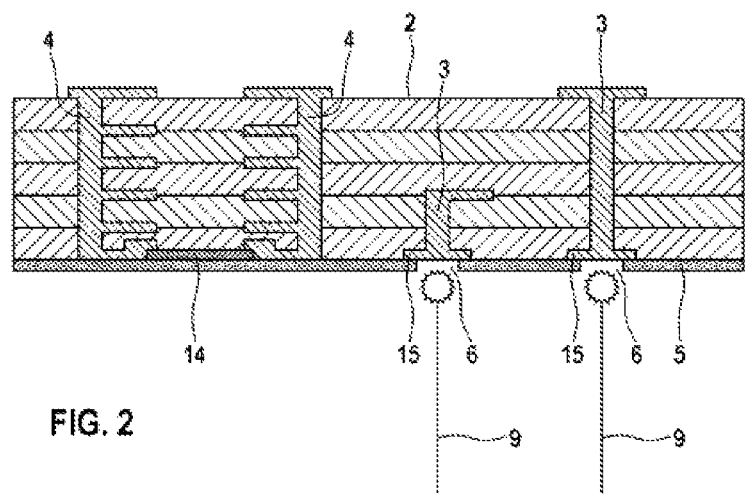
FIG. 2 shows the ceramic component in production as shown in FIG. 1 after the production of contact-making openings in the glaze.
Figure 3:
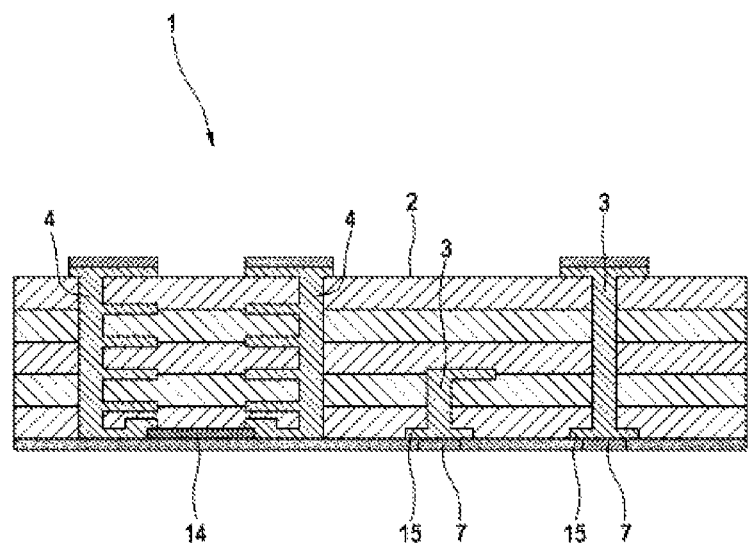
FIG. 3 shows the ceramic component in production as shown in FIG. 2 after the application of a metallic layer in each case in the region of the contact-making openings.

FIGS. 1 to 3 show different states of an embodiment of a ceramic component 1 according to the invention during its production in accordance with an embodiment of a method according to the invention. FIG. 3 shows the finished ceramic component 1.

For the production of the ceramic component 1, firstly a ceramic substrate 2 is provided, the surface of which is covered with a glaze 5 at least in regions. In this exemplary embodiment, the ceramic substrate 2 is a ceramic substrate having a plurality of substrate layers. The glaze 5 covers the underside of the ceramic substrate 2. Furthermore, a plurality of conductor tracks 3, 4, produced for example on the basis of silver, are situated in the interior and on the surface of the ceramic substrate 2. The conductor tracks are formed in sections as plated-through holes and make contact with, in particular, one or more resistors 14 which are arranged on the rear side of the ceramic substrate 2 and are covered by the glaze 5. The further conductor tracks 3 illustrated in FIG. 1 likewise comprise plated-through holes. In particular, the conductor tracks 3 have a contact-making region 15, which is situated on the rear side of the ceramic substrate 2 and which is likewise covered by the glaze 5. The conductor tracks 4 are designed for conducting electric current. The conductor tracks 3 can be thermal and/or electrical conductor tracks.

Furthermore, a layer composed of an anti-adherent 8 is situated between the respective contact region 15 of the conductor tracks 3 and the glaze 5. The anti-adherent 8 has the purpose of simplifying the opening of the glaze in the region of the contact regions 15 of the conductor tracks 3.

The processes for producing the intermediate state of the ceramic component 1 as shown in FIG. 1 are sufficiently known to the person skilled in the art. The individual layers of the ceramic substrate 2, provided with conductor tracks and, if appropriate, populated with electrical components, can be joined together by means of a sintering process. The application of the glaze 5 is advantageously effected in the context of this process. Before the glaze 5 is applied, the anti-adherent 8 is applied to the contact region 15 of the respective conductor tracks 3. The anti-adherent 8 is preferably a ceramic powder, the sintering temperature of which is greater than the softening temperature of the glaze 5. By way of example, an aluminum oxide ceramic powder is suitable as such an anti-adherent 8.

In order to uncover the contact regions 15 of the conductor tracks 3, in a subsequent step, in the region of the respective contact region 15, a contact-making opening 6 is produced in the glaze 5. In this exemplary embodiment, the contact-making opening 6 is obtained by exposure of the glaze 5 to a material-removing beam/jet 9. Such a beam/jet 9 can be, in particular, a laser beam or a water jet. When a water jet is used, it is advantageous to add an abrasive agent to it in order to increase its material-removing effect. In the case where a laser 9 is used, it is possible to use a glaze 5 with an additive that promotes the absorption of the laser radiation within the glaze 5.

The exposure of the glaze 5 in the region of the contact regions 15 is effected until the glaze 5 is removed in this region. The anti-adherent 8 promotes the production of the contact-making openings 6 since, in the region wherein it is applied, said anti-adherent prevents a fixed bonding of the glaze 5 to the contact region 15.

The exposure is continued until the anti-adherent 8 is also removed and the contact region 15 of the respective conductor track 3 is uncovered. The removal of the glaze 5 for producing the contact-making opening 6 and the removal of the anti-adherent 8 can, in particular, overlap. FIG. 2 shows the method state after this step has ended.

In principle, it is likewise possible to dispense with an anti-adherent 8 arranged between contact regions 15 and glaze 5. In this case, the production of the contact-making openings 6 in the glaze can likewise be effected by exposure to a material-removing beam/jet 9, in particular as described above.

In a subsequent step, a metallic layer 7 is applied in the region of the contact-making opening 6 for making contact with the contact regions 15 of the conductor track 3.

In order to apply the metallic layer 7 it is possible, by way of example, to use a chemical-electroless coating method, which is preferred according to the invention. The coating can be effected by means of a plating apparatus. In this way, deposition can be effected in a targeted manner onto the uncovered regions of the conductor tracks 3, 4, in particular onto the contact regions 15. Deposition directly onto the surface of the ceramic substrate 2 or onto the surface of the glaze 5 can be avoided. The metallic layer 7 can be produced by a nickel-palladium-gold metallization, for example.

FIG. 3 shows the ceramic component 1 after the application of the metallic layer 7.

In principle, further method steps can follow after this step. By way of example, the ceramic component 1 can be equipped with further electrical components. Furthermore, the resistors 14 can be trimmed, if this is not carried out in the context of producing the contact-making openings 6. For the purpose of trimming the resistors 14, a cut 16, in this respect see FIG. 4, is made in a resistor 14 preferably by means of a laser. The resistance of a resistor 14 can be increased in this way.

The metallic layer 7 applied on the contact regions 15 of the conductor tracks 3 forms a connection contact ("pad") for externally making contact with the conductor tracks 3. As required, a multiplicity of such connection contacts can be provided, as illustrated by way of example in FIG. 4, which shows the rear side of the ceramic component 1. The connection contacts formed by the metallic layer 7 are preferably arranged on the rear side of the ceramic substrate 2. This enables the simple and cost-effective connection of the ceramic component 1 to a connection component 12, for example to the housing of a control device for a motor vehicle application, as is shown in FIG. 4. In this exemplary embodiment, a BGA 10 is used in order to connect the connection contacts of the ceramic component 1 which are formed by the metallic layer 7 to connection contacts 13 of the connection component 12. A respective solder bead 11 of the BGA 10 is placed onto a metallic layer 7 applied in the region of the contact-making opening 6. The connection to the likewise metallic connection contacts 13 of the connection component 12 is effected by means of soldering.

The invention claimed is:

1. A method for producing a ceramic component (1), comprising the following steps: a) providing a ceramic substrate (2), wherein a conductor track (3) is situated in the interior and/or on the surface of the ceramic substrate (2), and the ceramic substrate (2) is covered with a glaze (5) at least in regions; b) producing a contact-making opening (6) in the glaze (5) in a region of a contact region (15) of the conductor track (3) with which contact is to be made; and c) applying a metallic layer (7) in a region of the contact-making opening (6) for making contact with the conductor track (3) in the contact region (15), wherein, for providing the ceramic substrate (2), before applying the glaze (5) to the ceramic substrate (2), an anti-dherent (8) is applied to the contact region (15) of the conductor track (3).

2. The method as claimed in claim 1, wherein a chemical-electroless coating method is used for applying the metallic layer (7).

3. The method as claimed in claim 1, wherein the anti-adherent (8) is a ceramic powder, a sintering temperature of which is greater than a softening temperature of the glaze (5).

4. The method as claimed in claim 1, wherein, in a further step, the anti-adherent (8) is removed in order to uncover the contact region (15) of the conductor track (3).

5. The method as claimed in claim 4, wherein the removal of the anti-adherent (8) is effected after the production of the contact-making opening (6) or in a manner overlapping the production of the contact-making opening (6) at least in sections.

6. The method as claimed in claim 1, wherein the production of the contact-making opening (6) comprises exposure to a material-removing beam/jet (9).

7. The method as claimed in claim 1, wherein the production of the contact-making opening (6) comprises exposure to a laser beam or to a water jet.

8. The method as claimed in claim 1, wherein the production of the contact-making opening (6) comprises exposure to a water jet admixed with an abrasive agent.

9. The method as claimed in claim 4, wherein the production of the contact-making opening (6) and the removal of the anti-adherent (8) comprise exposure to a material-removing beam/jet (9).

10. The method as claimed in claim 4, wherein the production of the contact-making opening (6) and the removal of the anti-adherent (8) comprise exposure to a laser beam or to a water jet.

11. The method as claimed in claim 4, wherein the production of the contact-making opening (6) and the removal of the anti-adherent (8) comprise exposure to a water jet admixed with an abrasive agent.

12. A ceramic component (1), comprising a ceramic substrate (2), a glaze (5) covering the ceramic substrate (2) at least in regions, and a conductor track (3) situated in the interior and/or on the surface of the ceramic substrate (2), wherein a layer of an anti-adherent (8) is situated between the glaze and a contact region of the conductor track.

13. The ceramic component as claimed in claim 12, wherein the ceramic substrate (2) has a plurality of ceramic substrate layers.

14. A component assembly, comprising a ceramic component (1) as claimed in claim 12, a connection component (12) and a BGA (ball grid array) (10), wherein the metallic layer (7) of the ceramic component (1) is connected to a connection contact (13) of the connection component (12) by the BGA (10).

15. The ceramic component as claimed in claim 12, wherein the glaze (5) has a contact-making opening (6), and the ceramic component has a metallic layer (7) in the region of the contact-making opening (6), wherein the metallic layer (7) makes contact with the conductor track (3).

* * * * *